United States Patent
Chen et al.

[19]

[11] Patent Number: 6,096,624
[45] Date of Patent: Aug. 1, 2000

[54] METHOD FOR FORMING ETOX CELL USING SELF-ALIGNED SOURCE ETCHING PROCESS

[75] Inventors: Hwi-Huang Chen; Gary Hong, both of Hsinchu, Taiwan

[73] Assignee: United Microelectronics Corp., Hsin-Chu, Taiwan

[21] Appl. No.: 08/992,884

[22] Filed: Dec. 18, 1997

[30] Foreign Application Priority Data

Sep. 10, 1997 [TW] Taiwan ................................. 86113088

[51] Int. Cl.$^7$ ................................................... H01L 21/76
[52] U.S. Cl. ........................ 438/443; 438/184; 438/257; 438/297
[58] Field of Search ................................. 438/433, 184, 438/257, 297

[56] References Cited

U.S. PATENT DOCUMENTS

| | | | |
|---|---|---|---|
| 5,445,981 | 8/1995 | Lee | 438/279 |
| 5,464,784 | 11/1995 | Crisenza et al. | 438/279 |
| 5,661,057 | 8/1997 | Fujiwara | 438/257 |
| 5,741,735 | 4/1998 | Violette et al. | 438/279 |
| 5,882,973 | 3/1999 | Gardner et al. | 438/279 |

OTHER PUBLICATIONS

S. Wolf Silicon Processing for the VSLI Era vol. 3 Lattice Press pp. 504, 514, 595–596, 634–635, 1990.

*Primary Examiner*—Charles Bowers
*Assistant Examiner*—David S Blum
*Attorney, Agent, or Firm*—J. C. Patents; Jiawei Huang

[57] ABSTRACT

A method for forming ETOX cells (Intel Type Flash EPROM Cell) using a self-aligned source etching process comprising the steps of depositing a silicon nitride layer up to a thickness of 100 Å to 700 Å, and then etching back the layer to form spacers. Thereafter, common source regions are defined using a photomask, and then the field oxide layer is etched using either a wet etching method or a dry etching method having a high selectivity ratio. The spacers are capable of protecting the oxide/nitride/oxide ONO layer against any damages during processing, thereby avoiding charge retention and reliability problems.

10 Claims, 5 Drawing Sheets

METHOD FOR FORMING ETOX CELL USING SELF-ALIGNED SOURCE ETCHING PROCESS

BACKGROUND OF THE INVENTION

1. Field of Invention

The present invention relates to a flash EPROM structure. More particularly, the present invention relates to a method for forming ETOX cells (Intel Type Flash EPROM Cells) using a self-aligned source etching process.

2. Description of Related Art

Erasable programmable ROM (EPROM) is a type of memory circuit commonly used in computer and electronic products. The advantage of EPROM is that stored data or programs will not be erased under normal circumstances. However, if the data or program really need to be erased, this can be done by shining an ultraviolet (UV) light source onto the EPROM for a period. Once the data or programs have been removed, new data or programs can then be entered and stored. Because all the old data and programs are lost during the EPROM erasing process and everything needs to be re-entered from scratch, much time is wasted in the process. In view of this, Intel Corp. has developed and introduced a kind of memory known as flash EPROM to the market. Data in the flash EPROM will not be completely wiped out in a single erase operation. Instead, data can be locally amended block by block. When the dimensions of flash EPROM are miniaturized, a self-aligned source etching process becomes the obvious choice for forming the ETOX cells. However, in a conventional method of producing ETOX cells, the plasma-etching operation will damage the oxide/nitride/oxide (ONO) layer. This will result in charge retention and reliability problems.

FIG. 1A is a layout diagram for a collection of ETOX cells formed by the conventional self-aligned source etching process. As shown in FIG. 1A, the labeled items include floating gates 13, control gates 15, masks 18, field oxide layers 17, drain regions 16b and a common source region 16a, which is patterned out according to masks 18. The area labeled 9 within a dotted rectangle is the location of an ETOX cell.

FIG. 1B is a cross-section along line I–I' in FIG. 1A. As shown in FIG. 1B, the ETOX cell comprises a gate, a common source region 16a and a drain region 16b. The gate is a four-layered stack including a tunnel oxide layer 12, a floating gate 13, an ONO layer 14 and a controlling gate 15. The controlling gate 15 and the floating gate 13 together constitute a gate terminal. The common source region 16a and the drain region 16b are formed in a substrate 11 on each side of the gate.

FIG. 1C is a cross-section along line II–II' in FIG. 1A. As shown in FIG. 1C, a field oxide layer is formed above the substrate 11, and that the controlling gate 15 is formed above the field oxide layer 17.

FIGS. 2A and 2B are cross-sectional views showing the progression of manufacturing steps in the production of ETOX cell by a conventional self-aligned source etching process. The cross-sectional line along which FIGS. 2A and 2B are derived from is the same as in FIG. 1C. First, a substrate structure having gates 15 and field oxide layers 17 already formed thereon is provided. The substrate structure here is similar to the one shown in FIG. 1C. The only difference between them is that a common source region 16a has not been formed in the substrate structure in FIG. 2A. Then, a photomask 18 is formed to cover the substrate and patterned such that locations of the common source regions 16a are exposed to get ready for subsequent processing operations.

Next, with reference to FIG. 1A, FIG. 1C and FIG. 2B, the exposed field oxide layer 17 is etched using a dry etching method having a high selectivity ratio. Thereafter, the photomask 18 is removed. This is followed by ion doping operations to form the common source region 16a and the drain region 16b. Because subsequent processes are familiar to those skilled in the art, detailed description is omitted here.

Because the conventional self-aligned source etching technique in forming the ETOX cells can easily damage the oxide/nitride/oxide layer of the gate, charge retention and reliability problems are quite common.

In light of the foregoing, there is a need in the art to improve the method of forming ETOX cells.

SUMMARY OF THE INVENTION

Accordingly, the present invention is directed to provide a method for forming ETOX cells using a self-aligned source etching process that can alleviate the charge retention and reliability problems due to in-process plasma damage of the ONO layer.

To achieve these and other advantages and in accordance with the purpose of the invention, as embodied and broadly described herein, the invention provides a method for forming ETOX cells by a self-aligned source etching process comprising the steps of first depositing a layer of dielectric, preferably a silicon nitride ($Si_3N_4$) layer, to a thickness of 100 Å to 700 Å, then etching back the layer to form a silicon nitride spacer. Thereafter, the common source region is defined using a patterned photomask. Subsequently, the field oxide layer is etched using a wet etching method or a dry etching method having a high selectivity ratio.

The characteristic of this invention is the ability to protect the oxide/nitride/oxide layer against any damages by plasma during the self-aligned source etching process that may lead to charge retention and reliability problems.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
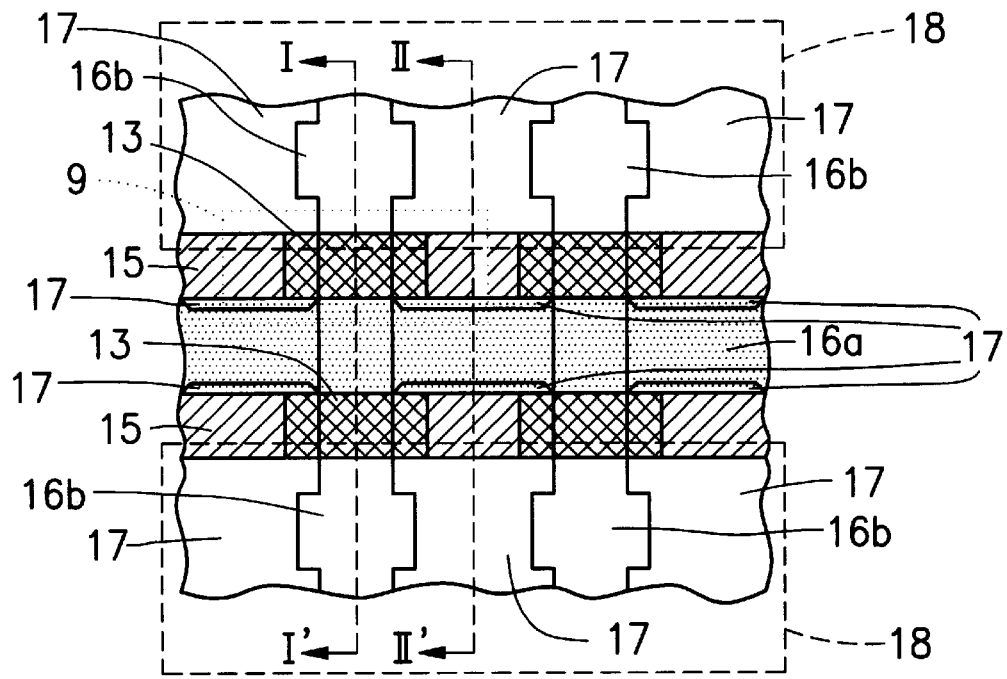
FIG. 1A is a layout diagram for a collection of ETOX cells formed by a conventional self-aligned source etching process.
Figure 1B:
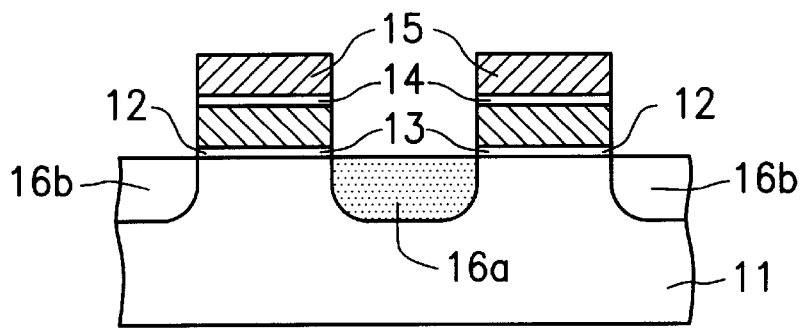
FIG. 1B is a cross-section along line I–I' in FIG. 1A.
Figure 1C:
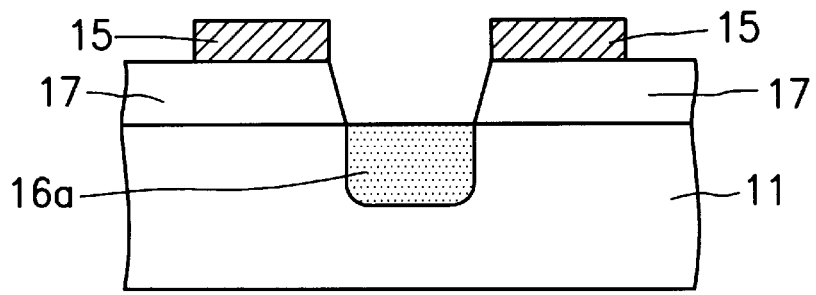
FIG. 1C is a cross-section along line II–II' in FIG. 1A.
Figure 2A:
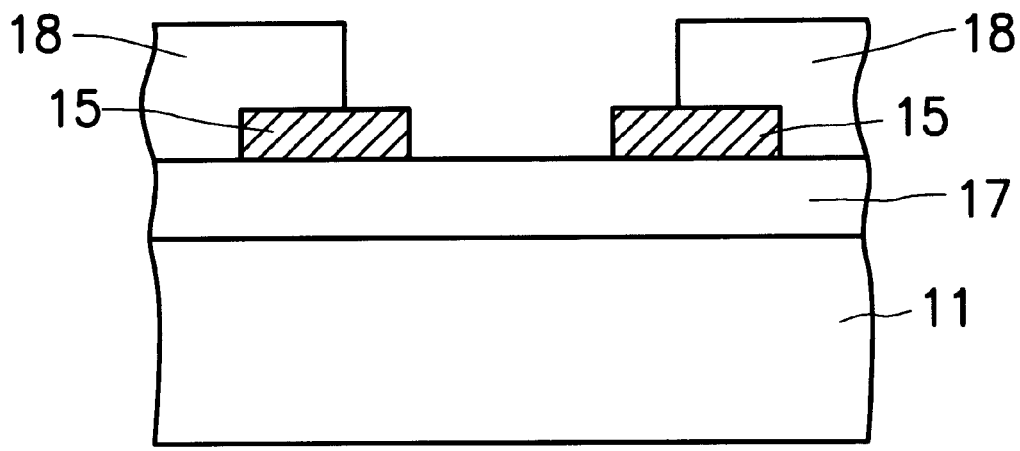
FIGS. 2A and 2B are cross-sectional views showing the progression of manufacturing steps in the production of an ETOX cell using a conventional self-aligned source etching process.
Figure 2B:
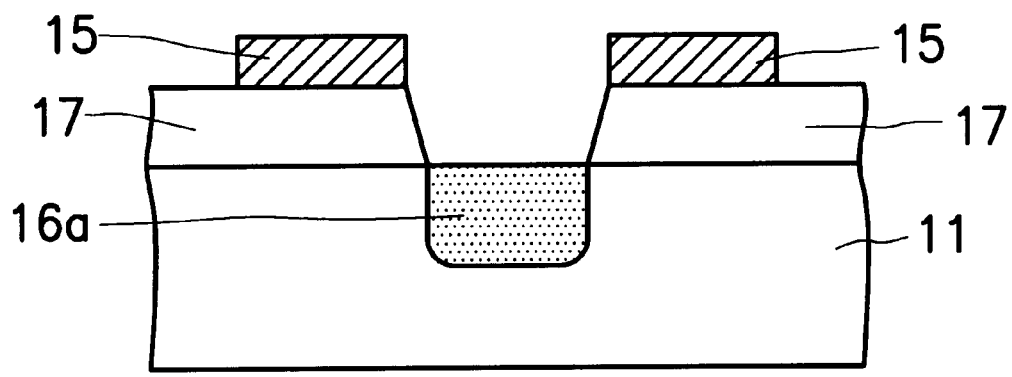

Reference will now be made in detail to the present preferred embodiments of the invention, examples of which are illustrated in the accompanying drawings. Wherever possible, the same reference numbers are used in the drawings and the description to refer to the same or like parts.

Figure 3A:
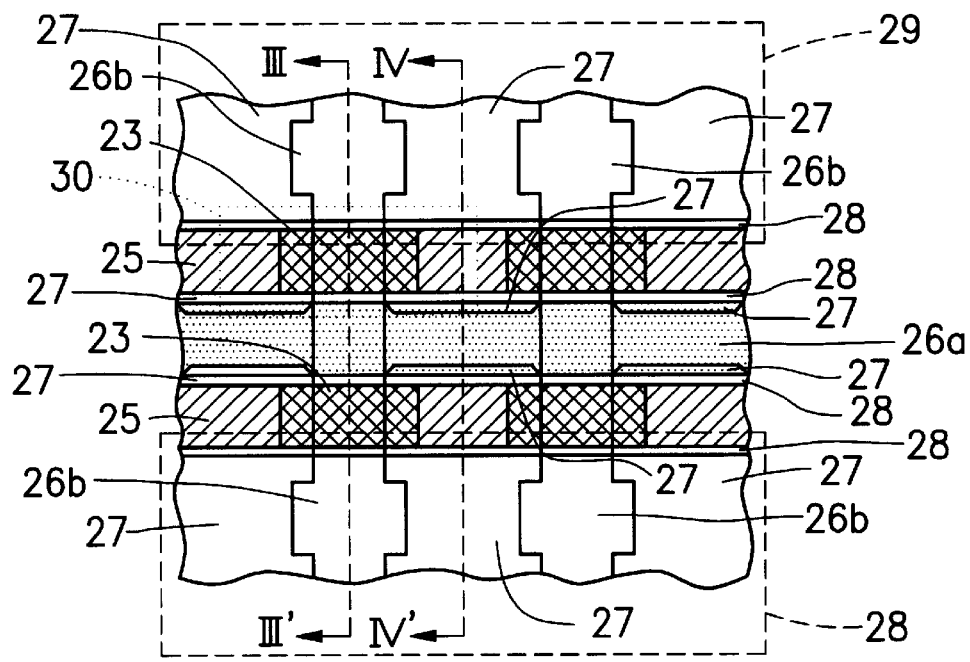
FIG. 3A is a layout diagram for a collection of ETOX cells formed by a self-aligned source etching process according to one preferred embodiment of this invention.

FIG. 3A is a layout diagram for a collection of ETOX cells formed by a self-aligned source etching process according to one preferred embodiment of this invention. As shown in FIG. 3A, the labeled items include floating gates 23, control gates 25, spacers 28, masks 29, field oxide layers 27, drain regions 26b and common source region 26a, which is patterned out according to masks 29. The area labeled 30 within a dotted rectangle is the location of an ETOX cell.

Figure 3B:
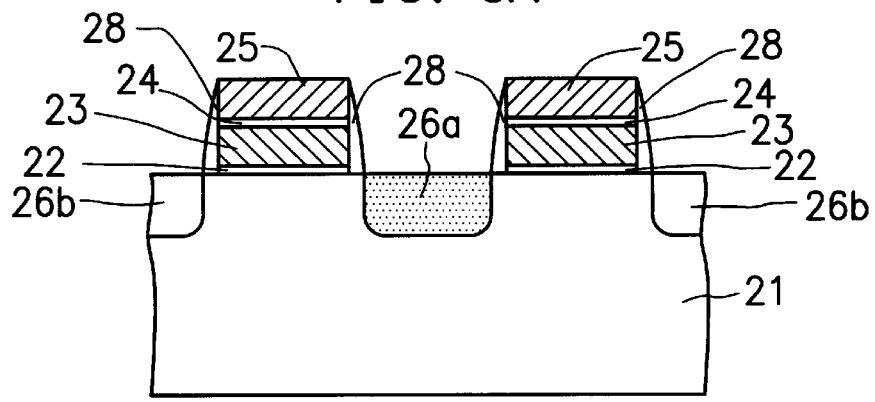
FIG. 3B is a cross-section along line III–III' in FIG. 3A.

FIG. 3B is a cross-section along line III–III' in FIG. 3A. As shown in FIG. 3B, the ETOX cell comprises a gate, a common source region 26a and a drain region 26b. The gate is a four-layered stack including a tunnel oxide layer 22, a floating gate 23, an ONO layer 24 and a controlling gate 25. The controlling gate 25 and the floating gate 23 together constitute a gate terminal. The common source region 26a and the drain region 26b are formed in a substrate 21 on each side of the gate.

Figure 3C:
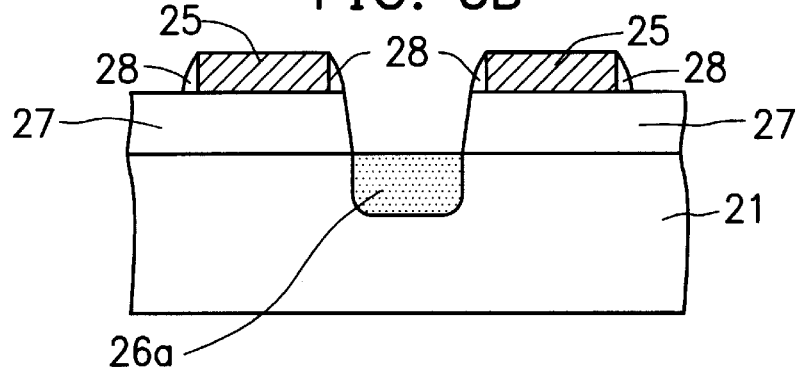
FIG. 3C is a cross-section along line IV–IV' in FIG. 3A.

FIG. 3C is a cross-section along line IV–IV' in FIG. 3A. As shown in FIG. 3C, a field oxide layer is formed above the substrate 21, and that the controlling gate 25 is formed above the field oxide layer 27.

Figure 4A:
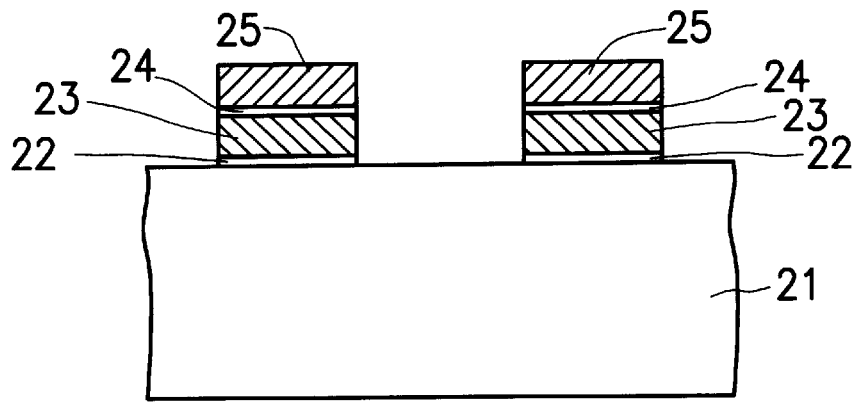
FIGS. 4A through 4C are cross-sectional views along line III–III' of FIG. 3A showing the progression of manufacturing steps in the production of ETOX cell using a self-aligned source etching process according to one preferred embodiment of this invention.
Figure 4B:
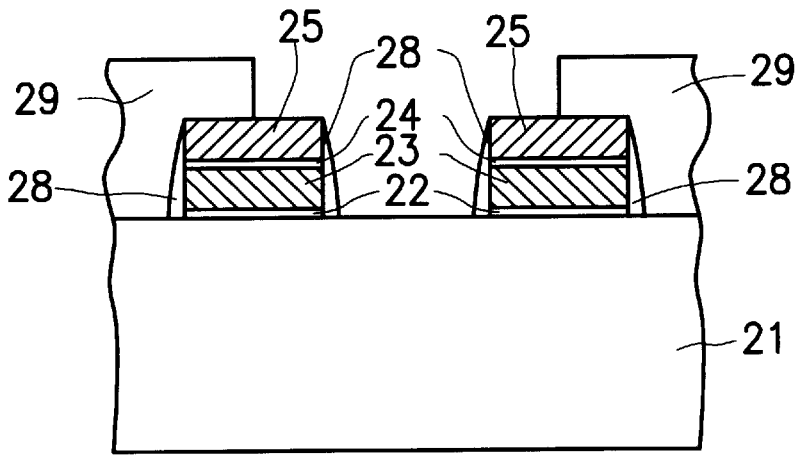
Figure 4C:
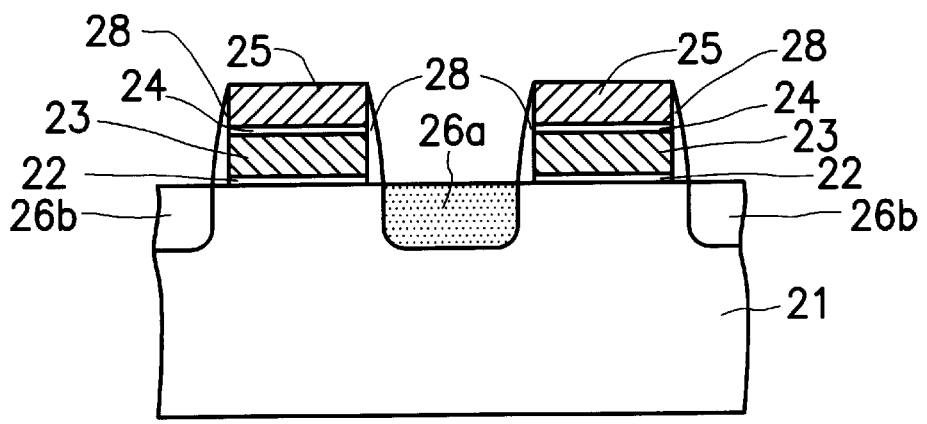

FIGS. 4A through 4C are cross-sectional views along line III–III' of FIG. 3A showing the progression of manufacturing steps in the production of ETOX cell using a self-aligned source etching process according to one preferred embodiment of this invention. As shown in FIG. 4A, a substrate structure that has gates 25 and field oxide layers 27 already formed thereon is provided. The substrate structure here is similar to the one shown in FIG. 3B. The cross-sectional line along which FIGS. 4A through 4C are derived from is the same as in FIG. 3B. The only difference between them is that a common source region 26a, drain regions 26b, and spacers 28 has not yet been formed in the substrate structure in FIG. 4A. The spacers 28 are formed by depositing a dielectric layer, preferably a silicon nitride ($Si_3N_4$) layer, to a thickness of 100 to 700, over the substrate structure, then etching back the dielectric layer to form a silicon nitride spacer 28 on the two sidewalls of a gate stack. Therefore, the ONO layer 24 is being protected by the spacer layer 28 as shown in FIG. 4B.

Figure 5A:
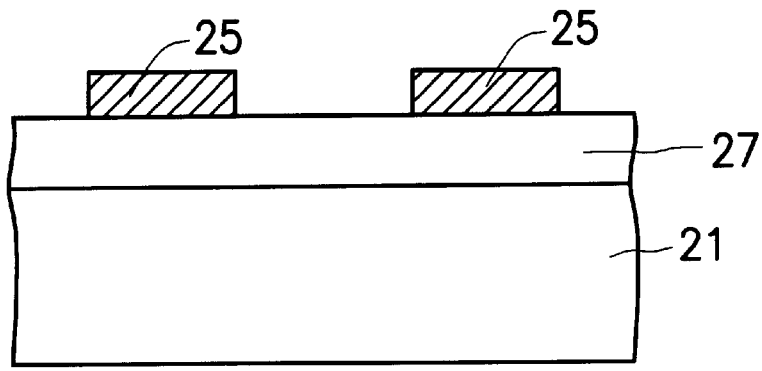
FIGS. 5A through 5C are cross-sectional views along line IV–IV' of FIG. 3A showing the progression of manufacturing steps in the production of ETOX cell using a self-aligned source etching process according to one preferred embodiment of this invention.
Figure 5B:
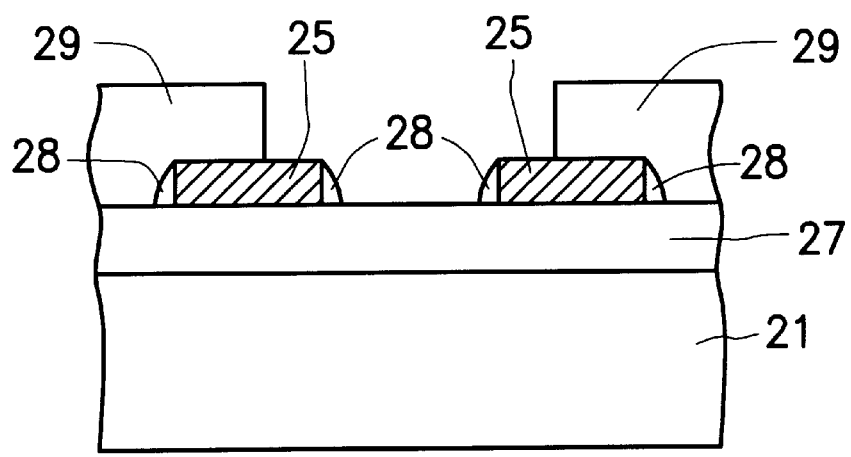
Figure 5C:
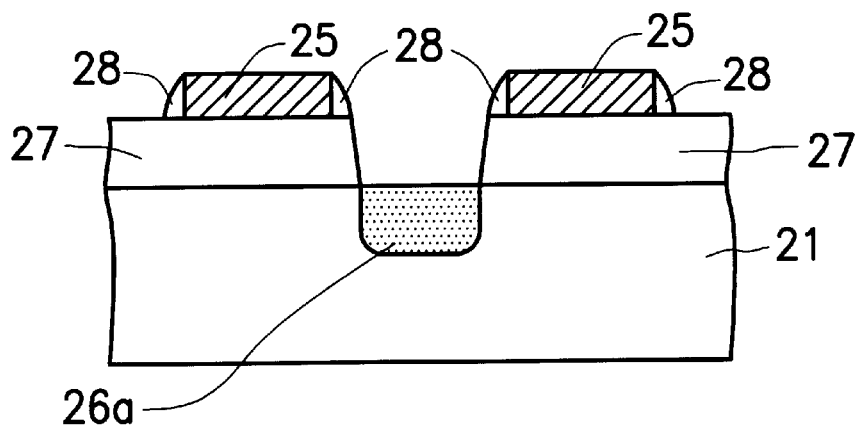

FIGS. 5A through 5C are cross-sectional views along line IV–IV' of FIG. 3A showing the progression of manufacturing steps in the production of ETOX cell using a self-aligned source etching process according to one preferred embodiment of this invention. The substrate structure is the same as in FIGS. 4A through 4C. Moreover, the cross-sectional line along which FIGS. 5A through 5C are derived from is the same as in FIG. 3C.

Next, with reference to FIG. 4B and FIG. 5B, a photomask 29 is used to form a pattern of the desired common source regions in the substrate 21.

Next, with reference to FIG. 3C and FIG. 5C, either a dry etching method having a high selectivity ratio such as a plasma etching method, or a wet etching method using a buffered oxide etchant (BOE) is used to etch away the exposed field oxide layer 27. The field oxide layer 27 is etched until the substrate surface 21 is reached, thereby exposing the desired common source locations. Thereafter, the photomask 29 is removed, and then ions are doped to form the common source region 26a and the drain regions 26b. Finally, subsequent conventional processes are performed.

Since the sequence of steps in the production of ETOX cells by the self-aligned source etching process in this invention involves forming spacers 28 first, then etching the field oxide layer 27, and finally performing an ion doping operation, damages to the ONO layer 24 during the plasma etching step is minimal. Hence, charge retention and reliability problems can be avoided.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing Intel Type Flash EPROM (erasable programming read-only memory) (ETOX) cells using a self-aligned source etching process comprising the steps of:

providing a substrate that has a plurality of gate stacks and a plurality of field oxide layers already formed thereon, each of the stack includes a tunnel oxide layer, a floating gate, a oxide/nitride/oxide layer and a controlling gate, wherein the controlling gates and the floating gates together constitute a plurality of gate terminals for a number of ETOX cells;

forming a plurality of spacers on each side of the gate stack sidewalls and next to the gate stacks;

forming a photomask over the substrate with a pattern exposing portions of the substrate and common source regions of the ETOX cells; and etching an exposed portion of the field oxide layer to expose the substrate, wherein the spacers remain exposed to this step of etching.

2. The method of claim 1, wherein step of forming the spacers includes depositing a dielectric layer, and then etching back the dielectric layer to form the spacers.

3. The method of claim 1, wherein after the step of removing the field oxide layer, further includes the substeps of:

removing the photomask; and
performing an ion implantation operation to define the common source region and forming drain regions in the substrate.

4. The method of claim 1, wherein the step of removing the field oxide layer includes dry etching.

5. The method of claim 4, wherein the step of dry etching includes using a plasma etching method.

6. The method of claim 1, wherein the step of removing the field oxide layer includes wet etching.

7. The method of claim 6, wherein the step of wet etching includes using a buffered oxide etchant.

8. The method of claim 1, wherein the step of forming spacers includes depositing silicon nitride.

9. The method of claim 2, wherein the step of depositing dielectric layer includes coating a silicon nitride layer.

10. The method of claim 2, wherein the step of depositing dielectric layer includes depositing up to a thickness of about 100 Å to 700 Å.

* * * * *